United States Patent
Zhu et al.

(10) Patent No.: US 8,896,302 B1
(45) Date of Patent: Nov. 25, 2014

(54) METHOD FOR MEASURING MAGNETIC INDUCTION INTENSITY OF MAGNETIC FIELD USING SHORT CAVITY FIBER LASER

(71) Applicant: Beijing Information Science & Technology University, Beijing (CN)

(72) Inventors: Lianqing Zhu, Beijing (CN); Fei Luo, Winchester, MA (US); Yinmin Zhang, Beijing (CN); Wei He, Beijing (CN); Mingli Dong, Beijing (CN); Xiaoping Lou, Beijing (CN); Yudong Jia, Beijing (CN)

(73) Assignee: Beijing Information Science & Technology University, Beijing (CN)

( * ) Notice: Subject to any disclaimer, the term of this patent is extended or adjusted under 35 U.S.C. 154(b) by 0 days.

(21) Appl. No.: 14/049,813

(22) Filed: Oct. 9, 2013

(30) Foreign Application Priority Data

Jul. 19, 2013 (CN) .......................... 2013 1 0305914

(51) Int. Cl.
*G01R 33/02* (2006.01)
*G01B 11/16* (2006.01)
*G01R 33/032* (2006.01)

(52) U.S. Cl.
CPC ................................... *G01R 33/032* (2013.01)
USPC .......................................... 324/244.1; 356/32

(58) Field of Classification Search
CPC ............. G01R 33/032; G01R 33/0327; G01R 33/126; G01R 33/323; G01R 15/245; G01R 15/246
USPC .......................................... 324/244.1; 356/32
See application file for complete search history.

(56) References Cited

U.S. PATENT DOCUMENTS

| | | | | |
|---|---|---|---|---|
| 4,634,977 A * | 1/1987 | Lenz et al. | ................. | 324/244.1 |
| 5,132,620 A * | 7/1992 | Rempt | ........................ | 324/244.1 |
| 5,513,913 A * | 5/1996 | Ball et al. | ....................... | 374/120 |
| 2013/0027030 A1 * | 1/2013 | Twerdochlib et al. | ...... | 324/244.1 |

OTHER PUBLICATIONS

PR Photonics, Fiber Lasers Oct. 7, 2007, retreived online via WayBackMachine Internet Archive at http://web.archive.org/web/20120522021657/http://www.rp-photonics.com/fiber_lasers.html.*

* cited by examiner

*Primary Examiner* — Patrick Assouad
*Assistant Examiner* — Hoang X Nguyen
(74) *Attorney, Agent, or Firm* — Tim Tingkang Xia, Esq.; Morris, Manning & Martin, LLP

(57) ABSTRACT

A method for measuring magnetic induction intensity of a magnetic field using a short cavity fiber laser, includes the steps of: a) arranging the short cavity fiber laser, where the short cavity laser has sequentially coupled laser diode pumping source, a wavelength division multiplexer, a fiber Bragg grating, an active optical fiber and a loop mirror; b) fixing the short cavity fiber laser on a magnetostrictive material; c) disposing the short cavity fiber laser and the magnetostrictive material in the magnetic field to be measured, and matching the stretching direction of the magnetostrictive material with the direction of the magnetic field to be measured; d) measuring the drift amount of longitudinal mode output by the short cavity fiber laser; and e) calculating the magnetic induction intensity of the magnetic field to be measured.

6 Claims, 3 Drawing Sheets

METHOD FOR MEASURING MAGNETIC INDUCTION INTENSITY OF MAGNETIC FIELD USING SHORT CAVITY FIBER LASER

CROSS-REFERENCE TO RELATED APPLICATIONS

This non-provisional application claims priority under 35 U.S.C. §119(a) on Patent Application No. 201310305914.4 filed in P.R. China on Jul. 19, 2013, the entire contents of which are hereby incorporated by reference.

TECHNICAL FIELD

The present invention relates to fiber lasers, and particularly to a method for measuring magnetic field based on the longitudinal mode output by the short cavity fiber laser.

BACKGROUND OF THE INVENTION

As a laser source having broad application prospects, the fiber laser has advantages of a tunable bandwidth, a high signal-to-noise ratio, and a narrow output laser linewidth, and can be widely used in fields such as fiber sensing, optical fiber communication, and optical processing. The fiber laser comprises three parts of a pumping source, a resonator cavity and a gain medium. The longer the cavity of the fiber laser is, the greater the nonlinear effect of the fiber laser will be. Thus it is necessary to shorten the length of the fiber. Meanwhile, short cavity is an important prerequisite to achieve single longitudinal mode operation for fiber lasers. Short cavity fiber lasers have simple structures and are easy to be implemented. Short cavity fiber lasers typically consist of a pair of fiber gratings, and a gain medium connected therebetween, and this structure is called a Distribute Bragg Reflection (DBR) type fiber laser. Short cavity fiber lasers are usually used to generate narrow linewidth laser output. NP Photonics, a U.S. company, utilized a 2 cm long erbium-doped phosphate glass fiber DBR laser to obtain a laser output with the power of 100 mW and the linewidth of 2 kHz. In 1992, Ball and others achieved a 1548 nm single frequency output with a linewidth of 47 kHz using a 980 nm LD pump source by adding two Bragg gratings into the two ends of the 50 cm long Er3+ doped fiber for the first time. The two Bragg gratings are 1.25 cm long with the same Bragg wavelength, and have reflectance of 72% and 80% respectively. In 2007, A-FR company developed a type of fiber laser with the cavity length less than 5 cm, linewidth less than 3 kHz and output power up to 150 mW.

The short cavity fiber laser has several advantages such as a few numbers of longitudinal mode output, and stable output with no mode-hopping phenomena, and it is often used in the field of fiber sensing. Therefore, there will be important theoretical significance and application value to designing a sensing system based on longitudinal mode output by the short cavity fiber laser.

In accordance with the physics definition, the magnetic field is a special form of field existing in space around the current, moving charge, magnetic or variable electric field. The measurement of the magnetic field is to sense the existence of the substance and to determine parameter values of the substance by experimental means, which is not only essential to the measurement of the magnetic, but also widely used in other fields. As the nature and intensity of the measured magnetic field vary greatly, the measuring methods are various. With the development of science and technology, especially discovery of new effect and new phenomenon in the field of solid state physics, methods for measuring the magnetic field, and the sensitivity and accuracy of measurement made great progress. The development of electronic technology and computer technology has greatly changed measurement of a magnetic field in the fields of automation and digitalization. Commonly used methods for measuring the magnetic field include a) current method: determining the magnetic field by measuring current based on the strict relationship between the current producing the magnetic field and the magnetic field; b) electromagnetic induction method: measuring the magnetic field utilizing Faraday's law of electromagnetic induction; and c) measuring the magnetic field utilizing magnetic effects of some materials (e.g. Hall Effect). Commonly used magnetic field measurement instruments include the electromagnetic induction magnetic field measurement instrument, the Hall Effect magnetic field measurement instrument, the magnetoresistive effect magnetic field measurement instrument, magnetic resonance magnetic field measurement instrument, and magneto-optical effect magnetic field measurement instrument.

Therefore, there is a need for a method and system for accurately measuring magnetic field utilizing the features of the short cavity fiber laser.

SUMMARY OF THE INVENTION

The object of the present invention is to provide a method and system for accurately measuring magnetic field using longitudinal mode output by short cavity fiber laser.

According to one aspect of the present invention, it is provided a method for measuring magnetic induction intensity of a magnetic field using a short cavity fiber laser, and the method includes the steps of: a) arranging the short cavity fiber laser, where the short cavity fiber laser includes a laser diode pumping source, a wavelength division multiplexer, a fiber Bragg grating, an active optical fiber and a loop mirror connected sequentially; b) fixing the short cavity fiber laser on a magnetostrictive material; c) disposing the short cavity fiber laser and the magnetostrictive material in the magnetic field to be measured, and matching the stretching direction of the magnetostrictive material with the direction of the magnetic field to be measured; d) measuring the drift amount of longitudinal mode output by the short cavity fiber laser; and e) calculating the magnetic induction intensity of the magnetic field to be measured.

Preferably, said calculating in the step e) is reading the magnetic induction intensity corresponding to the drift of output longitudinal mode as measured in the step d), based on a calibrated relation curve between the drift of longitudinal mode output by the short cavity fiber laser and the magnetic field.

Preferably, the relation curve between the drift of longitudinal mode output by the short cavity fiber laser and the magnetic field is calibrated by disposing the short cavity fiber laser fixed with magnetostrictive material in a known variable magnetic field.

Preferably, the relation curve is obtained by linear fitting or least square fitting.

Preferably, the active fiber of the short cavity fiber laser is selected from an erbium-doped fiber, an ytterbium-doped fiber or an Er/Yb co-doped fiber.

Preferably, a measuring piece made by the magnetostrictive material has a shape of plate, and the short cavity fiber laser is fixed on the plate-shaped measuring piece by a fixing unit.

Preferably, a measuring piece made by the magnetostrictive material has a shape of rod, and the short cavity fiber laser is twined on the rod-like measuring piece and is fixed by a fixing unit.

Preferably, the fixing unit is epoxy resin or acrylate.

Preferably, the magnetostrictive material is selected from Ni—Zn—Co Ferrite, $Fe_2Tb$ intermetallic compound, or Terbium dysprosium iron materials $Tb_{0.27}Dy_{0.73}Fe_{1.95}$.

Preferably, the loop mirror comprises a coupler with a splitting ratio of 0.50.

According to the present invention, the magnetic field can be measured accurately utilizing the features of the short cavity fiber laser. The arranged fiber laser has a small and simple structure, high measuring accuracy, good portability, and can be used in a variety of occasions.

It should be understood that the foregoing general description and the following detailed description are merely exemplary explanation, and shall not be construed as limiting the contents as claimed by the invention.

BRIEF DESCRIPTION OF DRAWINGS

Further objects, functions, and advantages of the present invention will be explained in details by embodiments of the present invention with reference to the accompanying drawings.

DETAILED DESCRIPTION OF THE INVENTION

Figure 1:
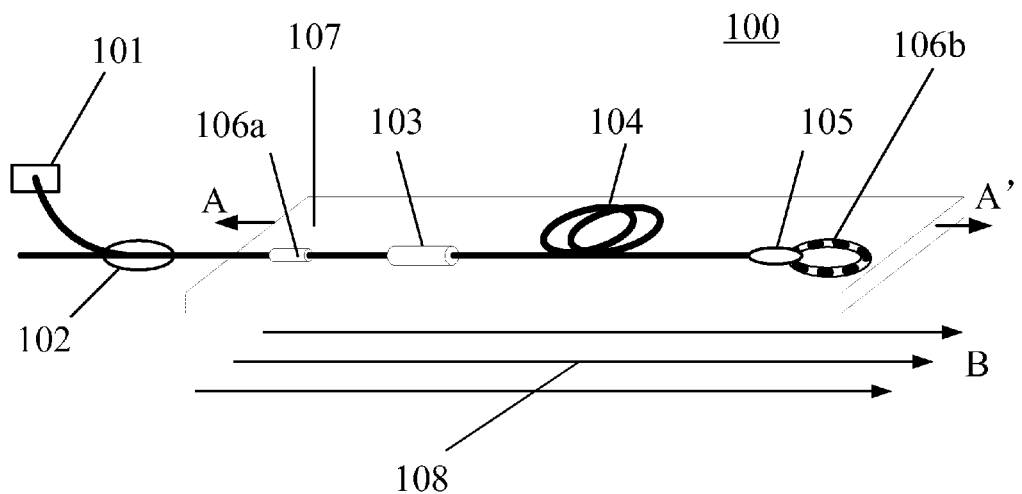
FIG. 1 schematically shows a short cavity fiber laser system for measuring magnetic field according to the first embodiment of the present invention.

Hereinafter, embodiments of the present invention will be explained in details with reference to drawings. In the accompanying drawings, like reference numerals designate the same or similar parts, or the same or similar procedures.

With reference to the exemplary embodiments, the purpose and function of the present invention and method to achieve these purpose and function will be explained. However, the present invention is not limited to the disclosed exemplary embodiments, and can be implemented with different forms. The description in nature is merely to help those skilled in the art to comprehensively understand the specific details of the invention.

The present invention will be described in detail with reference to the schematic figures. For the purpose of explanation, when describing the invention in details, the sectional figures representing the device structure will be partially enlarged not in general proportion, and the schematic figures are only exemplary and not intended to limit the scope claimed by the invention. Moreover, it should comprise three space dimensions of length, width and depth in the actual production.

The present invention provides a method for measuring magnetic field using a longitudinal mode output by a short cavity fiber laser. The short cavity fiber laser according to the present invention uses a laser diode as the pumping source for the fiber laser, and an active optical fiber doped with rare-earth elements as the gain medium for the fiber laser, together with a fiber Bragg grating (FBG), a fiber loop mirror (FLM), a wavelength division multiplexer (WDM) and a magnetostrictive material to achieve a calibration and measurement for magnetic induction intensity.

Resonance will occur in the laser when the cavity length of the laser resonator cavity is an integer multiple of the half wavelength of the laser. Therefore theoretically, there is infinite number of wavelength producing resonance in the resonator cavity. The interval between two adjacent resonant frequencies is referred as Free Spectral Range (FSR), and the optical path difference between two adjacent lasers is $\Delta=2\,nL$, where n is refractive index of the medium, L is physical length of the resonator cavity. FSR is the frequency interval between adjacent longitudinal mode output by the laser, and its physical meaning is the reciprocal of the time spent by a photon when making a round trip in the resonator cavity, and can be derived by the light speed in the vacuum c as:

$$FSR = \Delta v_q = \frac{c}{\Delta} = \frac{c}{2nL}, \quad (1)$$

$$\Delta V_q = v_{q+1} - v_q \quad (2).$$

Therefore, the shorter the cavity length of the resonator of the laser is, the larger the Free Spectral Range will be. The shorter the cavity length of the resonator of the laser is, the less the wavelength at which resonance may occur within the wavelength range of gain provided by gain medium will be, which will reduce the number of modes output by the laser. So a shorter cavity length L can reduce the longitudinal mode output, and is convenient for measuring interval of the modes. Stretching of the resonator cavity can be achieved utilizing the principle that the magnetostrictive material can stretch itself under the changes of the applied external magnetic field. When the cavity length L is elongated or shortened, the drift of longitudinal modes occurs. By calibrating the drift amount of longitudinal modes, the curve of the changes of the longitudinal modes changed with the magnetic field can be fitted, according to which the magnetic induction intensity within the scope of calibration can be measured.

Arranging Short Cavity Fiber Laser System

FIG. 1 schematically shows a short cavity fiber laser system 100 for measuring magnetic field according to the first embodiment of the present invention. The short cavity fiber laser system 100 includes a short cavity fiber laser, and the short cavity fiber laser has a laser diode pumping source 101, a wavelength division multiplexer 102, a fiber Bragg grating 103, an active optical fiber 104 and a loop mirror 105 which are sequentially coupled. The laser diode pumping source 101, the wavelength division multiplexer 102, the fiber Bragg grating 103, the active optical fiber 104 and the loop mirror 105 may be connected by fusion welding. The short cavity fiber laser 100 is fixed on a plate-shaped magnetostrictive material 107 by fixing units 106a and 106b, and then the system is arranged in a magnetic field 108 to be measured. The active optical fiber 104 is used as a gain medium of the short cavity fiber laser. The fiber Bragg grating 103 and the loop mirror 105 form as the two reflection ends of the resonator cavity. The wavelength division multiplexer 102 is used to couple the pumping light produced by the laser diode pumping source 101 into the active optical fiber 104. The fixing units 106a and 106b may be epoxy resin or acrylate as adhesive, and the two ends of the fiber Bragg grating 103 and loop mirror 105 are fixed on the surface of the magnetostrictive material 107 by the adhesive.

The short cavity fiber laser 100 and the magnetostrictive material 107 combined together are arranged in the magnetic field 108 to be measured, and the stretching direction of the magnetostrictive material matches with the direction of the magnetic field to be measured. The direction of the magnetic field 108 to be measured is shown as arrow B in FIG. 1. When magnetic induction intensity of the magnetic field 108 along the direction B changes, the magnetostrictive material 107 will stretch towards the respective ends along the arrow A-A' in FIG. 1. Therefore the cavity length of the short fiber laser attached to the magnetostrictive material 107 will increase, resulting in a drift of the longitudinal mode towards the long wave.

The active optical fiber 104 may have a shorter length (for example, in cm order of magnitude), preferably doped with rare-earth elements and having a high doping concentration (for example, Er/Yb co-doped with peak value absorption at 40±10 dB/m@1535 nm), so as to lower the pumping threshold of the system. The fiber Bragg grating 103 has a higher reflectance (reflectance is more than 90% for some specific wavelength) to reduce the number of longitudinal modes output by laser. The center wavelength of the fiber Bragg grating 103 determines the center wavelength of the laser output. The laser diode pumping source 101 is selected according to adsorption lines of the doped rare-earth element of the active optical fiber 104. Parameters of the wavelength division multiplexer 102, the fiber Bragg grating 103 and the loop mirror 105 according to the embodiment of the invention need to match the parameters of the pump wavelength, laser output wavelength, and active optical fiber. The specific parameters are shown in Table 1.

According to the present invention, the inner diameter of the optical fiber is determined by the active optical fiber. The cladding core diameter is preferably 125 μm, and the inner diameter of the fiber may be 4 μm, 8 μm or 10 μm. Preferably, the inner diameter of the fiber and the cladding core diameter are 10/125 μm. Corresponding core diameter of FLM, WDM and LD tail fiber are chosen according to the selected core diameter. Pump wavelength matching the Erbium-doped fiber may be 980 nm or 1480 nm, pump wavelength matching the Ytterbium-doped fiber may be 976 nm or 915 nm, and pump wavelength matching the Er—Yb co-doped fiber may be 976 nm. The parameters of FLM and WDM may be determined according to the wavelength and core diameter. The ultimate wavelength output by the laser is within a certain gain range of the active optical fiber (such as 1530-1560 nm), and is determined by the reflected wavelength of fiber Bragg grating. The typical emission wavelength of the Erbium-doped fiber is 1535 nm, the typical emission wavelength of the Ytterbium-doped fiber is 1064 nm, and the typical emission wavelength of the Er—Yb co-doped fiber is 1550 nm.

For example, in the present embodiment, if an Erbium-doped fiber with a core diameter of 10/125 μm is selected as the gain medium, the LD tail fiber, WDM and FLM will have the same type of core diameter. The output wavelength of LD is 976 nm, the operating wavelength of WDM is 976/1550 nm, the operating wavelength of FLM is 1550 nm, and FBG is selected to be in the range of 1530 nm-1560 nm, within which range laser output can be obtained. If an Ytterbium-doped fiber with a core diameter of 10/125 μm is selected as the gain medium in the present embodiment, the LD tail fiber, WDM and FLM will have the same type of core diameter. LD is single mode output at 915 nm, the operating wavelength of WDM is 915/1064 nm, the operating wavelength of FLM is 1064 nm, and FBG is selected to be near 1064 nm, within which range laser output can be obtained.

Figure 2:
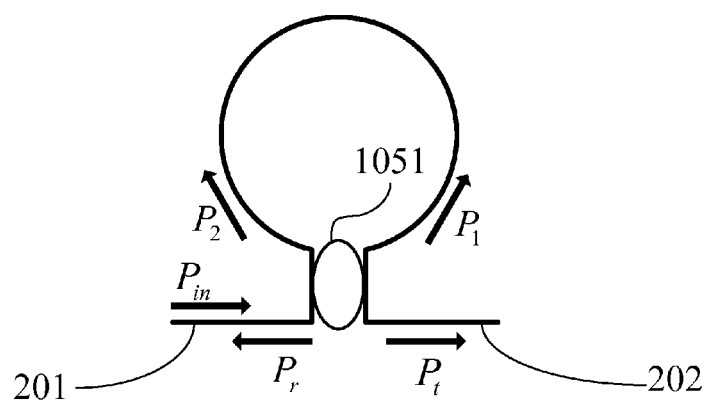
FIG. 2 is functional diagram of the loop mirror as shown in FIG. 1.

FIG. 2 shows the operating principle of loop mirror 105 in FIG. 1. As shown in FIG. 2, the loop mirror 105 according to the present invention is made by fusing two output terminals of a coupler 1051. When the signal light $P_{in}$ is inputted from the signal input terminal 201, the signal light is divided into two beams at two output terminals of coupler 1051. The two beams are light $P_1$ transmitted counterclockwise in FIG. 2 and light $P_2$ transmitted clockwise in FIG. 2. $P_1$ and $P_2$ are coherent in the coupler 1051 after transmitting, emitting the reflected light $P_r$ from the signal input terminal 201, and emitting the transmitted light $P_t$ from the signal output terminal 202. Assuming that a splitting ratio of the coupler 1051 is k and ignoring the loss of the coupler 1051 itself and the fiber, when the input light power is $P_{in}$, the reflected light power $P_r$ and the transmitted light power $P_t$ are as follows:

TABLE 1

Parameters of the short cavity fiber laser according to the present invention

| Doping element | Peak absorption | Cutoff wavelength | Cladding core diameter | Laser output wavelength | WDM wavelength | FLM wavelength |
|---|---|---|---|---|---|---|
| Er | 30 dB/m @ 1530 nm<br>80 dB/m @ 1530 nm | 800-980 nm | Single mode | 1530 nm-1560 nm | 976/1550 nm | 1550 nm |
| Yb | 280 ± 50 dB/m @ 920 nm<br>0.6 ± 0.2 dB/m @ 920 nm<br>1.8 ± 0.4 dB/m @ 920 nm | 1010 ± 70 nm | 125 μm | 1060 nm-1090 nm | 915/1064 nm | 1064 nm |
| Erbium-Ytterbium co-doped | 0.75 ± 0.15 dB/m @ 915 nm<br>40 ± 10 dB/m @ 1535 nm | 1440 ± 80 nm | | 1530 nm-1560 nm | 976/1550 nm | 1550 nm |

$$P_r = 4k(1-k)P_{in} \quad (3),$$

$$P_t = (1-2k)^2 P_{in} \quad (4).$$

Reflectivity R and transmittance T of the fiber loop mirror obtained from formula (3) and (4) are as follows:

$$R = 4k(1-k) \quad (5),$$

$$T = (1-2k)^2 \quad (6).$$

Therefore when the splitting ratio k=0.50, R=1 and T=0, the loop mirror 105 has the highest reflectivity, and plays a role of loop reflection mirror. So according to a preferred embodiment of the present invention, the splitting ratio of the coupler 1051 in the loop mirror 105 is 50:50, that is, k=0.50.

Figure 3:
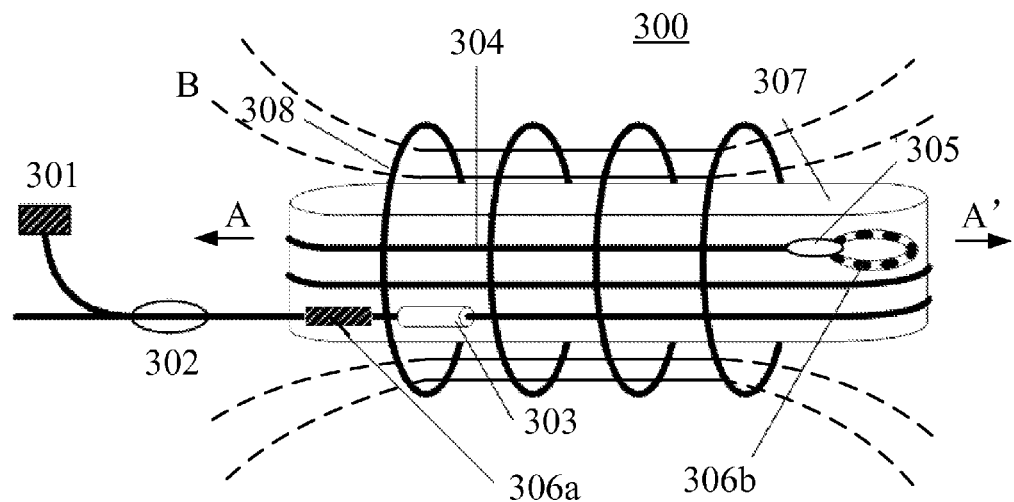
FIG. 3 schematically shows a short cavity fiber laser system for measuring magnetic field according to the second embodiment of the present invention.

FIG. 3 schematically shows a short cavity fiber laser system for measuring magnetic field according to the second embodiment of the invention. The short cavity fiber laser system includes a short cavity fiber laser, and the short cavity fiber laser has a laser diode pumping source 301, a wavelength division multiplexer 302, a fiber Bragg grating 303, an active optical fiber 304 and a loop mirror 305, which are sequentially coupled. The laser diode pumping source 301, the wavelength division multiplexer 302, the fiber Bragg grating 303, the active optical fiber 304 doped with rare-earth elements and the loop mirror 305 can be connected by fusion welding. The short cavity fiber laser is twined on the magnetostrictive material 307, and is fixed on the rod-like magnetostrictive material 307 by fixing units 306a and 306b. Then the whole system is arranged in the magnetic field to be measured, which is produced by a coil 308. The active optical fiber 304 doped with rare-earth elements is used as the gain medium of the short cavity fiber laser. The fiber Bragg grating 303 and the loop mirror 305 form as the two reflection ends of the resonator cavity. The wavelength division multiplexer 302 is used to couple the pumping light produced by the laser diode pumping source 301 into the active optical fiber 304. The fixing units 306a and 306b can be epoxy resin or acrylate as adhesive, and the two ends of the fiber Bragg grating 303 and loop mirror 305 are fixed on the surface of the magnetostrictive material 307 by the adhesive.

The magnetic field to be measured is produced by the current flowing through the coil 308, and the direction of the magnetic field is shown as a dotted line B in FIG. 3. When the magnitude of the magnetic field 308 along the direction B changes, the magnetostrictive material 307 will stretch towards their two ends along the arrow A-A' in FIG. 3. The cavity length of the short fiber laser attached to the magnetostrictive material 307 will increase, resulting in a drift of the longitudinal mode towards the long wave.

The parameters of the wavelength division multiplexer 302, the fiber Bragg grating 303 and the loop mirror 305 need to match the parameters of the pump wavelength, laser output wavelength, and active optical fiber. The specific parameters may be selected with reference to Table 1.

Calibration and Measurement of Magnetic Induction Intensity

Before measuring the magnetic field using the short cavity fiber laser system according to the present invention, the relationship between the change of longitudinal mode output by the short cavity fiber laser and the corresponding known magnetic induction intensity needs to be calibrated using known magnetic induction intensity of known variable magnetic field, and the corresponding curve for the relationship also needs to be drawn. The short cavity fiber laser system according to the present invention is fixed on a measuring piece made by a deformable magnetostrictive material or a giant magnetostrictive material, and then disposed in the magnetic field to be calibrated or measured. The shape and size of the magnetostrictive material will change as the applied magnetic field changes, which results in the change of the longitudinal mode output by the short cavity fiber laser fixed on the magnetostrictive material. Therefore, the magnetic field may be calibrated or measured using the changes of the longitudinal mode output based on the corresponding relationship of their changes.

The magnetostrictive material is selected from Ni—Zn—Co Ferrite, $Fe_2Tb$ intermetallic compound, or other materials having giant magnetostriction (such as, terbium dysprosium iron materials $Tb_{0.27}Dy_{0.73}Fe_{1.95}$). The shape of the measuring piece made of the magnetostrictive material or the giant magnetostrictive material can be chosen according to the direction of the magnetic field to be measured. For example, the magnetostrictive material may have the shape of a plate as shown in FIG. 1 or a rod as shown in FIG. 3. When the magnetostrictive material is made into a rod-shaped measuring piece, the magnetic field produced by a coil is calibrated or measured by inserting the magnetostrictive material rod into the hollow coil having a varying current.

Changes of the applied magnetic field causes changes of the shape and size of the magnetostrictive material, results in stretching, bending, vibration or extrusion of the resonator cavity of the fiber laser fixed on the magnetostrictive material, elongates or shortens the cavity length of the resonator, and leads to drift of the longitudinal mode. Specifically, when the cavity length is elongated, the longitudinal mode output drifts towards a longer wave, and when the cavity length is shortened, the longitudinal mode output drifts towards a shorter wave. By gradually increasing the magnitude of the applied magnetic induction intensity, recording the numerical values of the drift of the longitudinal mode, and then fitting a curve, calibration can be done by the recorded data and fitted curve. Therefore, the curve of the drift amount of the longitudinal mode, changing in regard to the changes of magnetic induction intensity, is obtained. Based on the structure of the short cavity fiber laser system shown in FIG. 3, by using giant magnetostrictive material $Tb_{0.27}Dy_{0.73}Fe_{1.95}$, and applying constant current to a solenoid coil 308, the coil will produce magnetic induction intensity inside.

Total magnetic motive force of a magnetic core coil is $$NI = H_0\delta + H_1 l_1 \quad (7),$$

where N is total number of turns of the coil, I is current to be measured flowing through the coil, $H_0$ is magnetic induction intensity of the air gap, $\delta$ is the length of the air gap, $H_1$ is magnetic induction intensity inside the magnetic core, $l_1$ is length of the magnetic circuit of the magnetic core. According to the principle that magnetic fluxes are equal everywhere in the magnetic circuit, and supposing the sectional area of the magnetic circuit is S, then $$\mu_0 H_0 \delta S = \mu_r H_1 l_1 S \quad (8),$$

where $\mu_0$ is permeability of vacuum, and $\mu_r$ is permeability of giant magnetostrictive material. Magnetic induction intensity of air gap will be obtained as follows:

$$H_0 = \frac{\mu_r NI}{(\mu_0 + \mu_r)\delta}. \quad (9)$$

In the magnetostrictive linear region of the material, the strain of the magnetostrictive material is $\epsilon_m = kH_0$, where $\epsilon_m$ is a superposition effect of the strain of the grating and the strain of the fiber. When the strain of fiber is ignored, only $\epsilon_f$ will be considered. k is sensitivity coefficient of the magnetostrictive material. Therefore the strain of fiber grating is $$\varepsilon_f = \frac{k\mu_r NI}{k'(\mu_0 + \mu_r)\delta}, \quad (10)$$

where $$k' = \frac{E_{f2}A_{f2}L_1 + E_{f1}A_{f1}L_2}{E_{f2}A_{f2}L_m}.$$

$E_{f1}$ and $E_{f2}$ are elastic modulus of the grating portion and fiber portion respectively. $A_{f1}$ and $A_{f2}$ are sectional areas of the grating portion and fiber portion respectively. $L_1$ is length of the grating, $L_2$ is length of the fiber, and $L_m$ is length of the magnetostrictive material. Only considering the deformation of the grating and not considering the deformation of the fiber, wavelength offset of the fiber grating $\Delta\lambda_B$, drift of longitudinal mode, is obtained as follows:

$$\Delta\lambda_B = \frac{0.78k\mu_r NI\lambda_B}{k'(\mu_0 + \mu_r)\delta}. \quad (11)$$

According to the above formula (9) and (11), it can be known that $\Delta\lambda_B$ and the magnetic induction intensity $H_0$ of the magnetic field to be measured have a linear relationship, that is:

$$\Delta\lambda_B = \frac{0.78k\lambda_B}{k'}H_0. \quad (12)$$

Adjusting the current through the coil can change the magnitude of the magnetic induction intensity produced by the current, and such a change can be represented by the Bragg wavelength offset. $\Delta\lambda_B$ is the varied amount of output wavelength. By collecting the changing trend of $\lambda_B$ using the spectrometer, the interval of $\lambda_B$ can be read as the longitudinal mode spacing.

The magnetic induction intensity $H_0$ and the longitudinal mode spacing $\Delta\lambda_B$ may be fitted as a curve as follows:

Linear fitting may be adopted as the curve fitting, as shown in formula (13):

$$y = ax + b \quad (13).$$

Alternatively, the curve fitting may be the least square fitting, and the curve as fitted can be obtained by formulas (14) and (15).

$$\frac{\partial S}{\partial a_0} = \sum_{i=0}^{n}(y_i - a_0 - a_1 x_i) = 0, \quad (14)$$

$$\frac{\partial S}{\partial a_1} = \sum_{i=0}^{n}(y_i - a_0 - a_1 x_i) = 0. \quad (15)$$

By solving the above equations, $a_0$ and $a_1$ will be obtained, and an approximating function satisfying the square approximation condition is obtained as, $$f(x) = a_0 + a_1 x \quad (16).$$

Figure 4:
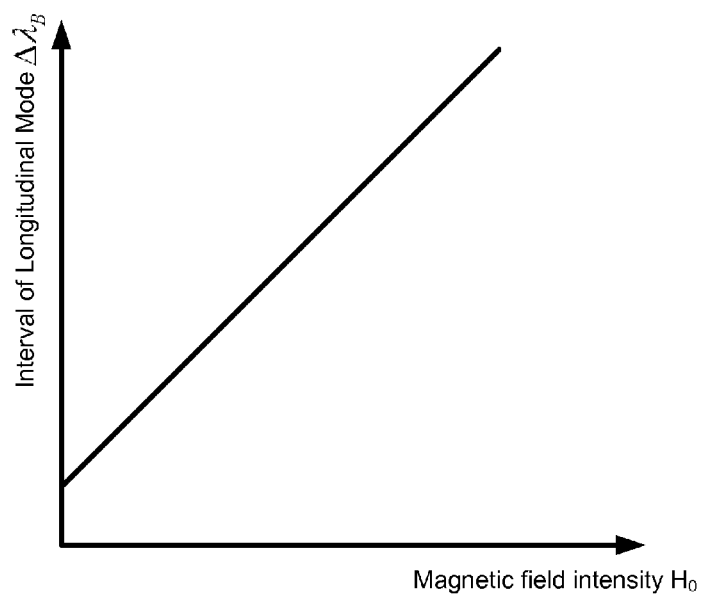
FIG. 4 is a fitted relation curve between magnetic induction intensity and drift of longitudinal mode output by laser.

Finally, the applied magnetic induction intensity can be determined by the relationship curve between the magnetic induction intensity and the drift amount of the longitudinal mode output by the laser. The magnetic field of the resonator cavity can be determined using the calibrated magnetic induction intensity curve. FIG. 4 shows a fitted relationship curve between the magnetic induction intensity and the drift amount of longitudinal mode output by the laser.

For measuring the magnetic field using the calibrated relation curve between the magnetic induction intensity and the drift amount of laser longitudinal mode, the short cavity fiber laser fixed with the magnetostrictive material according to the invention will be disposed in the magnetic field to be measured. By collecting the changing trend of the wavelength $\lambda_B$ of the laser output by a spectrometer, the interval of $\lambda_B$, that is, the varied amount of the longitudinal mode $\Delta\lambda_B$, is obtained. Referring to the calibrated relation curve between the known magnetic induction intensity and the drift amount of longitudinal mode of the laser, the magnetic induction intensity of the magnetic field to be measured can be obtained.

Figure 5:
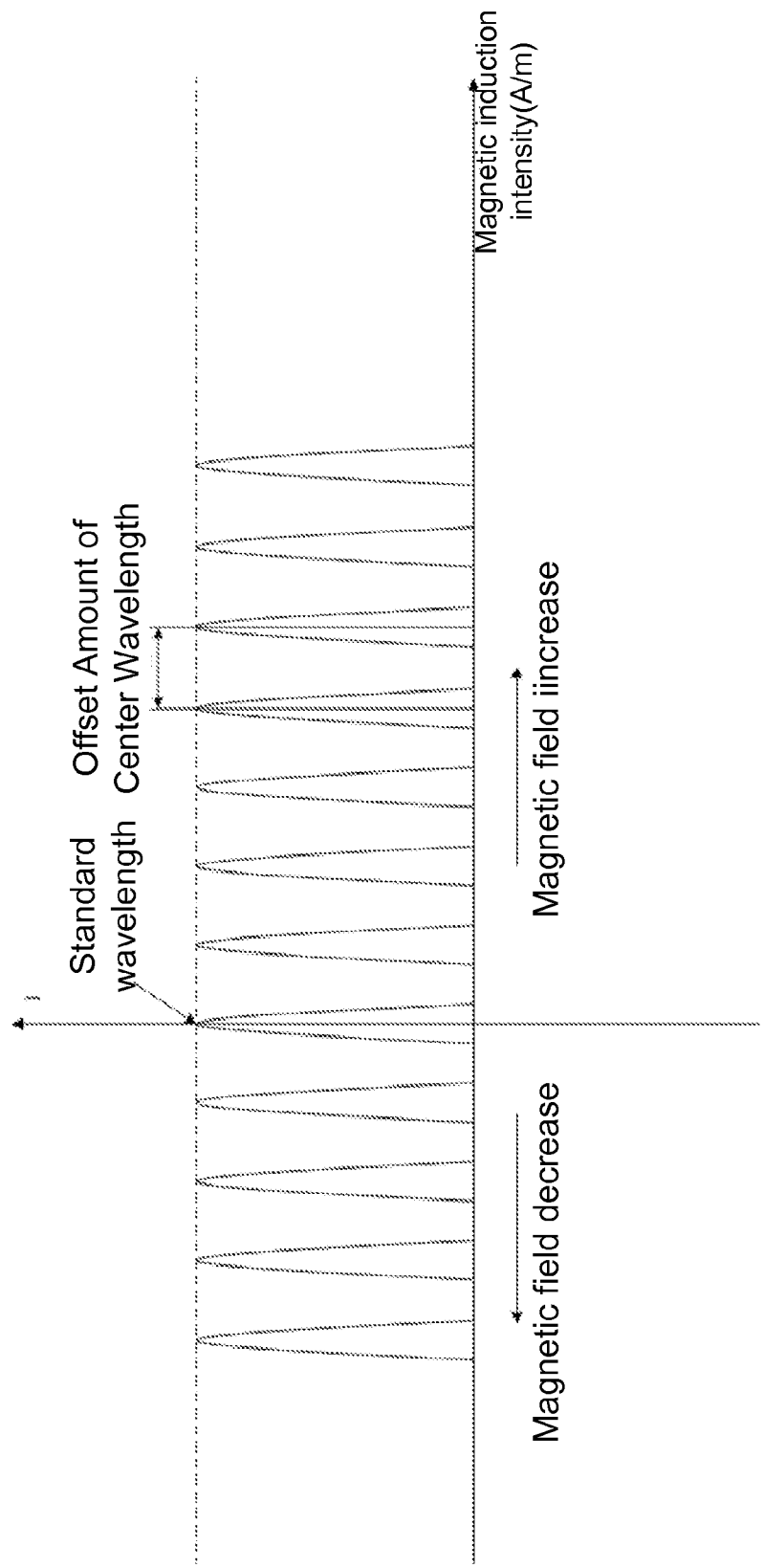
FIG. 5 is a waveform graph showing the drift of longitudinal mode output by laser changed with the change of magnetic induction intensity.

FIG. 5 schematically shows a waveform graph in which drift of longitudinal mode output by the laser changes in regard to magnetic induction intensity. As shown in FIG. 5, the laser according to the present invention is a single longitudinal mode output. A wavelength at specific magnetic induction intensity is calibrated as a standard wavelength. When the magnetic induction intensity of the magnetic field increases, the center wavelength of the standard wavelength offsets to the right side of the figure, and when the magnetic induction intensity of the magnetic field decreases, the center wavelength of the standard wavelength offsets to the left side of the figure. By collecting the changing trend of the wavelength $\lambda_B$ output by the laser using a spectrometer, the offset amount of the center wavelength can be obtained, and then the magnetic induction intensity of the magnetic field to be measured can be obtained referring to the curve.

According to the present invention, the magnetic field can be measured accurately utilizing the features of the short cavity fiber laser. The arranged fiber laser has a small and simple structure, high measuring accuracy, good portability, and can be used in a variety of occasions.

Combined with the disclosed description and practice of the present invention, it is easy for those skilled in the art to contemplate and understand other embodiments of the invention. The description and embodiments are merely exemplary, and the scope and spirit of the invention will be limited by the claims.

What is claimed is:

1. A method for measuring magnetic induction intensity of a magnetic field using a short cavity fiber laser, comprising the steps of:
    a) providing the short cavity fiber laser, comprising:
        a laser diode pumping source;
        a wavelength division multiplexer connected to the laser diode pumping source;
        a fiber Bragg grating connected to the wavelength division multiplexer;
        an active optical fiber connected to the fiber Bragg grating; and
        a loop mirror connected to the active optical fiber;
    b) fixing the short cavity fiber laser on a magnetostrictive material;
    c) disposing the short cavity fiber laser and the magnetostrictive material in the magnetic field to be measured to match a stretching direction of the magnetostrictive material with a direction of the magnetic field to be measured;
    d) measuring a drift of a longitudinal mode of the short cavity fiber laser; and
    e) calculating the magnetic induction intensity corresponding to the drift of the longitudinal mode from an equation of:

$$\Delta\lambda_B = \frac{0.78k\lambda_B}{k'}H_0,$$

wherein $\Delta\lambda_B$ represents the drift of the longitudinal mode, $\lambda_B$ represents the longitudinal mode, $H_0$ represents the magnetic induction intensity of the magnetic field, k represents the sensitivity coefficient of the magnetostrictive material, and $$k' = \frac{E_{f2}A_{f2}L_1 + E_{f1}A_{f1}L_2}{E_{f2}A_{f2}L_m},$$

wherein $E_{f1}$ and $E_{f2}$ represent elastic modulus of the fiber Bragg grating and the active optical fiber respectively, $A_{f1}$ and $A_{f2}$ represent the sectional area of the fiber Bragg grating and the active optical fiber respectively, $L_1$ represents the length of the fiber Bragg grating, $L_2$ represents the length of the active optical fiber, and $L_m$ represents the length of the magnetostrictive material.

2. The method according to claim 1, wherein the active optical fiber of the short cavity fiber laser is selected from the group consisting of an erbium-doped fiber, an ytterbium-doped fiber, and an Er/Yb co-doped fiber.

3. The method according to claim 1, wherein the magnetostrictive material has a shape of a plate, and the short cavity fiber laser is fixed on the plate-shaped magnetostrictive material by a fixing unit.

4. The method according to claim 3, wherein the fixing unit is epoxy resin or acrylate.

5. The method according to claim 1, wherein the magnetostrictive material is selected from the group consisting of Ni—Zn—Co Ferrite, $Fe_2Tb$ intermetallic compound, and Terbium dysprosium iron materials.

6. The method according to claim 1, wherein the loop mirror comprises a coupler with a splitting ratio of 0.50.

* * * * *